United States Patent
Macours

(10) Patent No.: US 9,894,194 B2
(45) Date of Patent: Feb. 13, 2018

(54) MOBILE DEVICE

(71) Applicant: NXP B.V., Eindhoven (NL)

(72) Inventor: Christophe Marc Macours, Leuven (BE)

(73) Assignee: NXP B.V., Eindhoven (NL)

( * ) Notice: Subject to any disclaimer, the term of this patent is extended or adjusted under 35 U.S.C. 154(b) by 96 days.

(21) Appl. No.: 14/315,060

(22) Filed: Jun. 25, 2014

(65) Prior Publication Data

US 2015/0011264 A1    Jan. 8, 2015

(30) Foreign Application Priority Data

Jul. 2, 2013    (EP) .................................... 13174791

(51) Int. Cl.

| H04B 1/06 | (2006.01) |
|---|---|
| H04M 1/00 | (2006.01) |
| H04M 9/00 | (2006.01) |
| H04R 5/00 | (2006.01) |
| H04R 29/00 | (2006.01) |

(Continued)

(52) U.S. Cl.
CPC ............ H04M 1/605 (2013.01); H03G 5/005 (2013.01); H03G 5/165 (2013.01); H04M 1/6041 (2013.01); H04R 2499/11 (2013.01)

(58) Field of Classification Search
CPC ........ H04B 1/3838; H04B 1/40; H03G 5/005; H03G 5/165; H03G 7/002; H03G 3/02; H03G 5/025; H04M 1/0202; H04M 1/0214; H04M 1/0245; H04M 1/03; H04M 1/035; H04M 1/05; H04M 1/60; H04M 1/605; H04M 1/6016; H04M 1/6033; H04M 1/6041; H04M 1/6058; H04M 1/6066; H04M 1/72519; H04M 9/082;

(Continued)

(56) References Cited

U.S. PATENT DOCUMENTS

| 4,429,181 A * | 1/1984 | Freadman ................ H04R 3/04 333/28 T |
| 4,893,342 A * | 1/1990 | Cooper ................... H04S 1/005 381/26 |

(Continued)

FOREIGN PATENT DOCUMENTS

| CN | 102165521 A | 8/2011 |
| EP | 2 574 015 A1 | 3/2013 |

OTHER PUBLICATIONS

Extended European Search Report for EP Patent Appln. No. 13174791.7 (dated Dec. 5, 2013).

*Primary Examiner* — Yuwen Pan
*Assistant Examiner* — Paul P Tran
(74) *Attorney, Agent, or Firm* — Rajeev Madnawat

(57) ABSTRACT

Mobile devices such as mobile phones typically have two speakers, one for use in a hand-set mode and one for use in a hands-free mode. A mobile device (1100) is described operable to switch between a hand-set mode and a hands-free mode, the mobile device includes a receiver speaker (10) operable in the hand-set mode and the hands-free mode of the mobile device, and a hands-free speaker (12) operable in the hands-free mode of the mobile device. The mobile device is operable in hands-free mode to route at least one audio signal to the receiver speaker and the hands-free speaker. Using the hands-free speaker and the receiver speaker may improve the sound quality without increasing the cost.

19 Claims, 7 Drawing Sheets

(51) Int. Cl.
*H04R 3/00* (2006.01)
*G10L 21/00* (2013.01)
*H04M 1/60* (2006.01)
*H03G 5/00* (2006.01)
*H03G 5/16* (2006.01)

(58) Field of Classification Search
CPC .......... H04R 1/1041; H04R 3/00; H04R 3/04; H04R 3/12; H04R 29/00; H04R 5/02
USPC ..... 455/74, 403, 550.1, 556.2, 569.1, 569.2, 455/575.1, 575.2, 575.3; 379/388.01, 379/388.02, 420.01, 420.02, 420.3, 420.4, 379/422, 423, 433.02; 381/388.01, 381/388.02, 420.01, 420.02, 420.3, 420.4, 381/422, 423, 433.02; 704/270
See application file for complete search history.

(56) References Cited

U.S. PATENT DOCUMENTS

| | | | | |
|---|---|---|---|---|
| 5,224,151 A * | 6/1993 | Bowen | ................ | H04M 1/6016 340/524 |
| 5,297,198 A * | 3/1994 | Butani | ................ | H04M 9/085 379/388.01 |
| 5,757,931 A * | 5/1998 | Yamada | ................ | G10K 15/12 381/17 |
| 5,826,187 A * | 10/1998 | Core | ................ | H04M 1/6033 455/412.1 |
| 6,882,335 B2 * | 4/2005 | Saarinen | ................ | G06F 1/1605 345/156 |
| 7,133,527 B2 * | 11/2006 | Kasperkovitz | ....... | H03D 1/2209 381/2 |
| 7,466,829 B1 * | 12/2008 | Anderson | ............. | H03G 7/002 381/103 |
| 8,401,178 B2 | 3/2013 | Chen et al. | | |
| 9,356,571 B2 * | 5/2016 | Burgett | ................... | H03G 3/02 |
| 2002/0042287 A1 | 4/2002 | Asami | | |
| 2004/0179693 A1 * | 9/2004 | Abel | ...................... | H04S 1/002 381/1 |
| 2007/0038457 A1 * | 2/2007 | Hwang | ............... | H04M 1/6033 704/270 |
| 2007/0076892 A1 * | 4/2007 | Kim | ........................ | H04R 5/04 381/17 |
| 2010/0046766 A1 * | 2/2010 | Gregg | ...................... | H04R 3/12 381/59 |
| 2014/0161279 A1 * | 6/2014 | Jones | ...................... | H04R 3/12 381/97 |

* cited by examiner

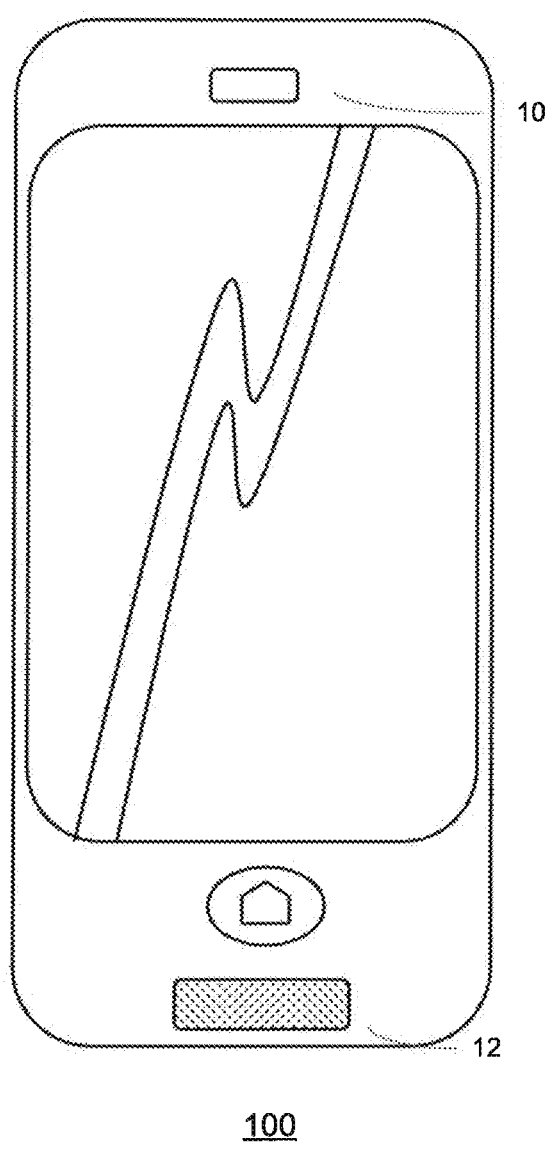
FIGURE 1 - PRIOR ART

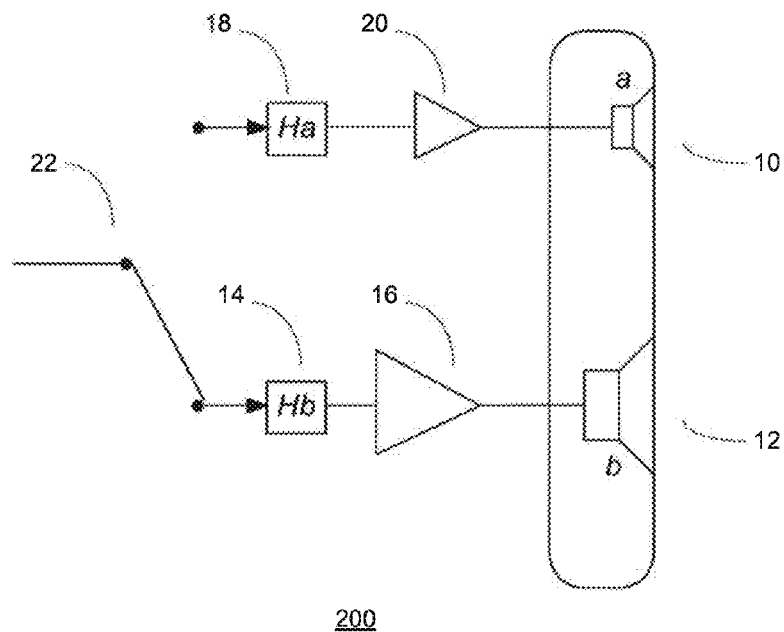
FIGURE 2 - PRIOR ART
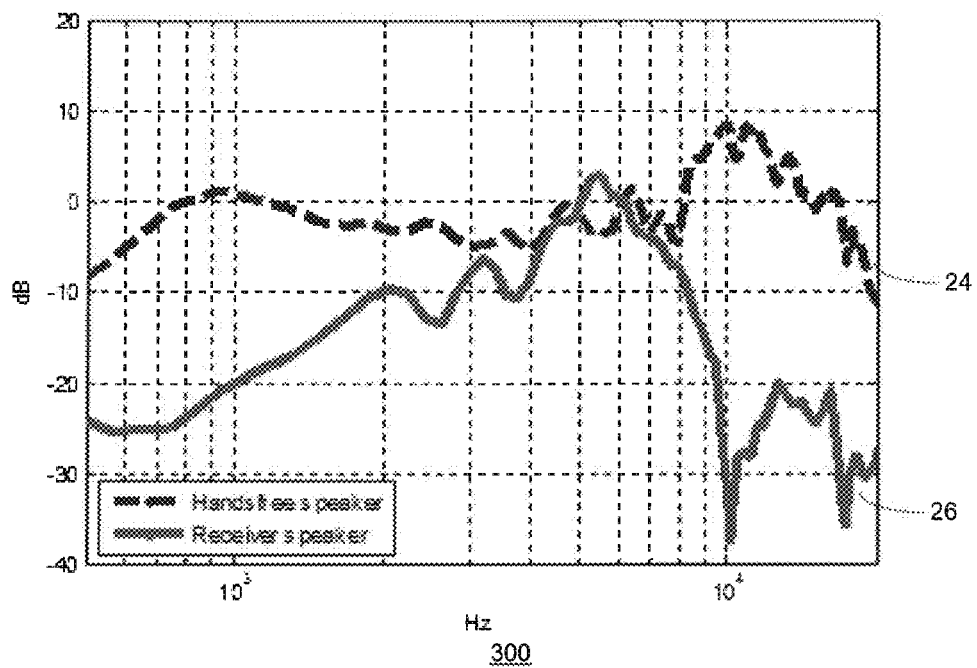
FIGURE 3

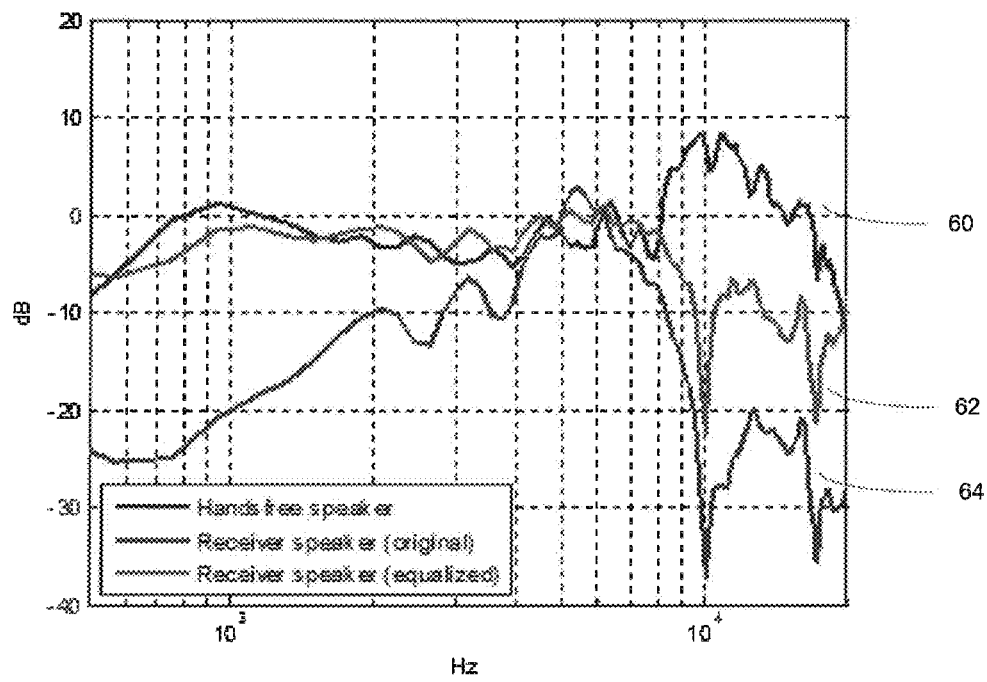
(a)
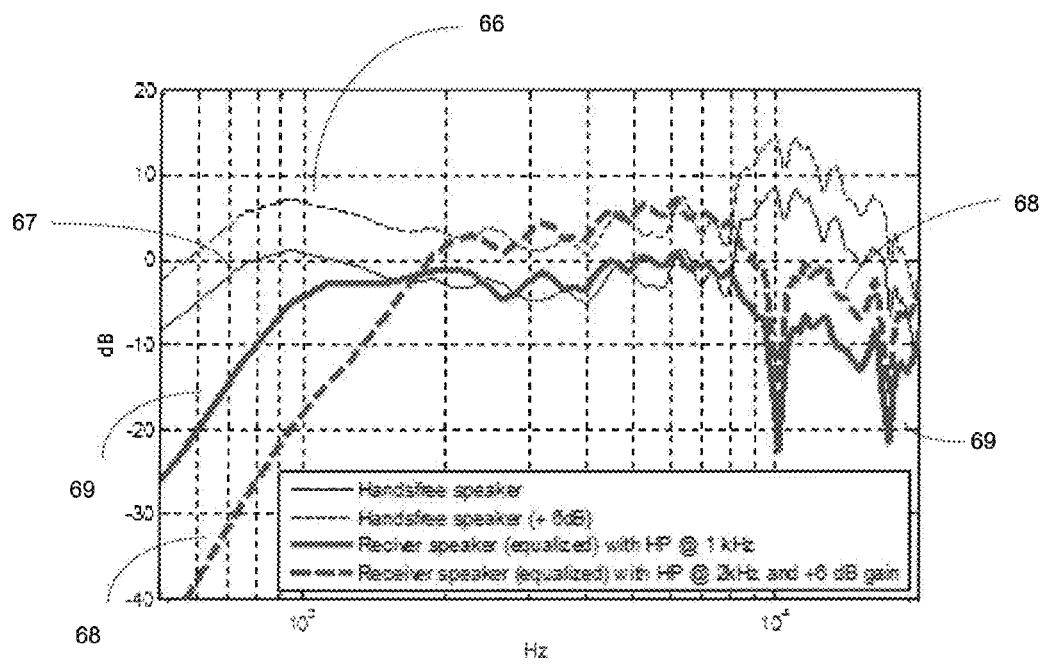
(b)
FIGURE 10

MOBILE DEVICE

CROSS-REFERENCE TO RELATED APPLICATIONS

This application claims the priority under 35 U.S.C. § 119 of European patent application no. 13174791.7, filed on Jul. 2, 2013, the contents of which are incorporated by reference herein.

This invention relates to mobile devices operable to switch between handset and hands-free modes of operation.

Most mobile devices such as mobile phones and tablets support hand-set and hands-free or speakerphone sound reproduction modes.

An example known mobile phone 100 is shown in FIG. 1. In handset mode, a so-called receiver loudspeaker 10 is used. The receiver loudspeaker 10 or speaker is acoustically designed and tuned for providing an optimal acoustic response when acoustically coupled with the ear. The acoustical port of the receiver loudspeaker 10, which is the sound outlet in the phone housing, is always located at the top of the front side of the phone. The nominal impedance of the receiver loudspeaker 10 is typically 16 or 32 Ohms and it is typically driven by a dedicated power amplifier having a maximum peak output voltage equal or lower than the battery supply voltage which may be typically equal to or less than 3.7 or 4.2 Volts.

The hands-free speaker 12 is typically mounted in a closed-box, most of the time placed at the bottom of the phone, either front firing (HTCOone®), back firing (HTC® 8X) or side firing (iPhone®5). The hands-free speaker 12 is designed and tuned to provide its optimal acoustic response in far-field listening conditions. Its nominal impedance is typically 4 to 8 Ohms and it is typically driven by a boosted power amplifier having a maximum peak output voltage of 5 Volts or more.

FIG. 2 shows a typical arrangement used in mobile devices. Receiver equalization filter 18 and hands-free equalization filter 14 represent equalization filters intended to tailor the acoustical responses of the receiver and hands-free speakers respectively.

Hand-set and hands-free modes are mutually exclusive with either the receiver speaker or hands-free speaker active. This is schematically represented in FIG. 2 by a switch 22 which in practice may be implemented in software, hardware or a combination of software and hardware. The reason for this is that both speakers are designed to work optimally in their respective use-cases. The receiver speaker 10 has a smaller size resulting in a lower efficiency (SPL/Watt) and lower mechanical and thermal limits than the larger hands-free speakers; the receiver speaker has higher DC impedance which may typically be 32 Ohms.

This limits the output power possibilities when used in combination with an audio amplifier with a limited rail voltage as currently used for receiver speakers. The receiver speakers 10 are usually designed to be used in open-back configuration, characterized by the fact the speaker back enclosure is not sealed. This results in an acoustical shortcut which degrades the far-field reproduction, especially at low frequencies.

FIG. 3 shows the frequency spectra 300 of the receiver and hands-free speakers measured in far-field, typically 20 cm from the speaker, on a typical smart-phone such as the iPhone® 5 when electrically driven by the same signal. This signal could be for example low level white noise. Whereas the hands-free speaker has a reasonably flat frequency response 24, the far-field receiver speaker frequency response 26 is by far inferior in terms of audio quality.

Some mobile devices are equipped with two hands-free speakers, for example the HTCOne® with two front firing hands-free speakers. This results in a noticeable improvement both in sound pressure level and stereo imaging. However, using two hands-free speakers is expensive in terms of bill of material, space and power consumption.

Aspects of the invention are defined in the accompanying claims. In a first aspect there is described a mobile device operable to switch between a hand-set mode and a hands-free mode, the mobile device comprising a receiver speaker operable in the hand-set mode and the hands-free mode of the mobile device, and a hands-free speaker operable in the hands-free mode of the mobile device; wherein the mobile device is operable in hands-free mode to route at least one audio signal to the receiver speaker and the hands-free speaker.

The receiver speaker in combination with the hands-free speaker results in a broader spatial sound image compared to the hands-free speaker alone.

In embodiments, the mobile device may include a receiver equalization filter having an output coupled to the receiver speaker, a hands-free equalization filter having an output coupled to the hands-free speaker; wherein the mobile device is operable in hands-free mode to route the at least one audio signal to the inputs of the receiver equalization filter and the hands-free equalization filter. The receiver equaliser filter may be used to shape the frequency response to more closely match the high frequency response of the receiver speaker to that of the hands-free speaker. In embodiments the receiver equalization filter may have a first filter characteristic in the hand-set mode, and a second different filter characteristic in the hands-free mode.

In embodiments the mobile device may comprise a high pass filter wherein the mobile device is operable in hands free mode to couple the high pass filter and the receiver equalization filter in a filter cascade and to route the at-least one audio signal to the filter cascade.

The high pass filter blocks out the low frequencies from the receiver speaker in hands-free mode to limit the excursion of the speaker membrane of the loudspeaker. The high pass filter and the receiver equalization filter may be arranged in a cascade. The order of the filters in the cascade may be changed without affecting the performance.

In embodiments, the mobile device may comprise a cross-path filter with the input of the cross-path filter coupled to the input of the receiver speaker and the output of the cross-path filter is coupled to the input of the hands-free speaker. The cross-path filter may have a low pass filter characteristic.

In embodiments the cross-path filter and the high-pass filter may be operable as a cross-over filter network. In a cross-over filter network, the stop band of the low pass filter may correspond to the pass band of the high pass filter. In some embodiments there may be some overlap between the stop band and pass band.

When the audio signal is stereo having two audio channels, the frequencies in the first channel blocked by the high pass filter are routed to the hands-free speaker and mixed with the second channel. This may ensure the audio content of the original stereo signal is not lost.

In embodiments, the mobile device may transmit the same audio signal to the receiver speaker and the hands-free speaker. For mono audio signals the cross-path filter is not required since all the audio content is in one channel.

In embodiments where the audio signal is a stereo signal, the mobile device is operable in hands-free mode to transmit the first channel of the audio signal to the hands-free speaker and the second channel of the audio signal to the receiver speaker.

In embodiments the mobile device may include a spatial sound processor. The spatial sound processor 42 may use processing techniques known to the skilled person to provide a further improved spatial sound experience in the form of stereo widening or 3D virtualization. These techniques may include polarity inversion, which results in a dipole (figure of eight) frequency response that is known to provide an increased perceived sound stage width.

Embodiments which, in hands-free mode, have a high-pass filter on the receiver audio signal path may comprise a low pass filter having an output coupled to an input of the hands-free equalization filter. This may be used for a mono signal input or down-mixed stereo signal input in hands-free mode and allows a cross-over mode of operation. Since the hands-free speaker is typically larger than the receiver speaker, the bass frequencies of the audio signal are transmitted or routed to the hands-free speaker and the treble frequencies are transmitted or routed to the receiver speaker. The cross over frequency may be chosen such that the hands-free speaker is operated in the frequency range where only mechanical protection is required and the receiver speaker may be operated in the range where only thermal protection is required. This may simplify the speaker coil monitoring and protection required in this mode and may improve the perceived sound quality.

Embodiments of the mobile device may comprise a receiver audio processor coupled to an input of the high pass filter, a hands-free audio processor coupled to the input of the hands-free equalizer filter, and a gain aligner coupled to the hands-free audio processor, the receiver audio processor, and the high-pass filter; wherein the gain aligner is operable to align the time varying gain between an audio signal routed to the receiver speaker and a further audio signal routed to the hands-free speaker.

The audio processors on the respective audio signal paths may be adjusted by the gain aligner so that the time varying gain is aligned. This may be done for example by setting both gains to a minimum value. This may compensate for the variation in processing gains between the respective audio signal paths to the hands-free speaker and the receiver speaker due to the different characteristics of the audio signal paths.

At high audio playback levels, the receiver audio path gain may be limited to prevent amplifier clipping or speaker damage. The gain alignment results in a suboptimal use of the hands-free speaker. The gain aligner can also dynamically control the high-pass filter cut-off frequency. A higher cut-off frequency increases signal headroom and which may allow a higher gain on the receiver audio path and consequently, due to the gain alignment, on the hands-free audio path as well. At low playback levels, the high-pass filter cut-off frequency can be reduced without generating a gain reduction. This may increase the frequency range where both loudspeakers are acoustically matched, resulting in a better spatial rendering of the audio.

Embodiments of the mobile device may include a tablet computer, mobile phone or any other mobile device having a hands free mode and handset mode. A hand-set mode of operation may be considered to be a mode where a speaker is working in a near field operation mode which may be less than 1 cm from the ear of a user. A hands-free mode of operation may be considered to be a mode where a speaker is working in a far field operation mode which may be greater than 10 cm from the ear of a user. A hands-free speaker may be any speaker configured to function in a far-field operation mode.

In a second aspect there is described a method of generating an acoustic output from a mobile device, the mobile device comprising a receiver speaker and a hands-free speaker, the method comprising in response to switching the mobile device into a handset mode, routing an audio signal to the receiver speaker, and in response to switching the mobile device into a hands-free mode, routing at least one audio signal to the receiver speaker and the hands-free speaker.

Embodiments of the invention are now described in detail, by way of example only, illustrated by the accompanying drawings in which:

FIG. 1 shows a known smart phone speaker system.

FIG. 2 illustrates a known amplifier and speaker configuration for the smart phone of FIG. 1.

FIG. 3 shows the typical frequency responses for the smart phone speaker system of FIG. 1.

FIG. 10 shows example frequency responses of hands free and receiver speakers for one or more embodiments.

Figure 4:
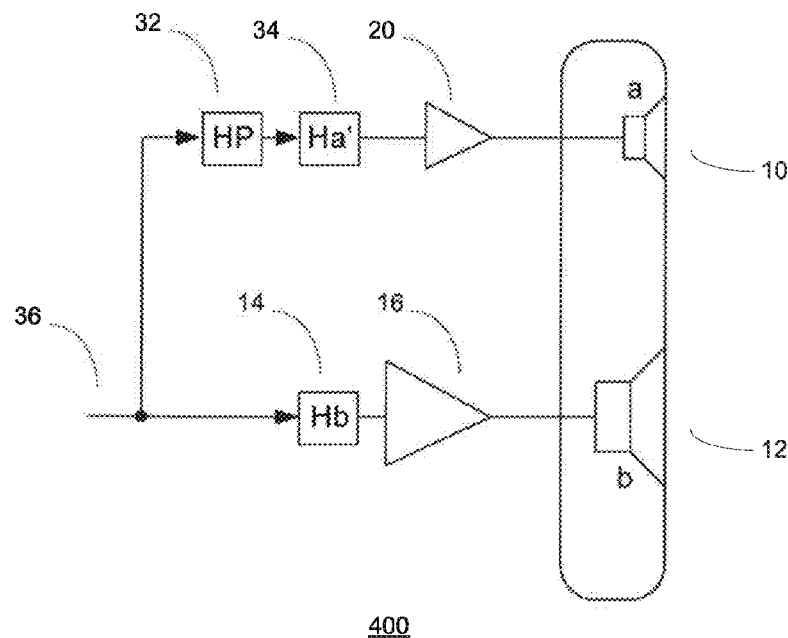
FIG. 4 illustrates a mobile device for a mono audio signal according to an embodiment.

FIG. 4 shows a mobile device 400 having a receiver speaker 10 and a hands-free speaker 12 and configured in the hands-free mode of operation. A high pass filter 32 may be connected to a receiver equalisation filter 34. The output of receiver equalisation filter 34 may be connected to a receiver amplifier 20. The output of receiver amplifier 20 may be connected to the receiver speaker 10. The combination of high pass filter 32, receiver equalisation filter 34, receiver amplifier 20, and the receiver speaker 10 may form a first audio signal path. Hands-free equalisation filter 14 has an output connected to an input of a hands-free speaker amplifier 16. The output of hands-free amplifier 16 may be connected to the hands-free loudspeaker 12. The combination of hands-free equalisation filter 14, hands-free speakerphone 16, and hands-free loudspeaker 12 may form a second audio signal path. The mobile device 400 is configured to transmit a mono audio signal or a down-mixed stereo signal. Consequently the audio signal contains only one channel. In this case, the audio signal may be routed both to the first audio signal path and the second audio signal path. Consequently both audio signal paths receive the same audio signal. The skilled person will appreciate that for the handset mode of operation for mobile device 400, which is not shown in FIG. 4, the signal path and filtering operation may be the same as shown for the mobile phone 100. Switching between the two modes of operation may be done in software, hardware or a combination of software and hardware.

The high pass filter 32 and equalization filter 34 may match the acoustic response of the receiver speaker 10 with that of the hands-free speaker 12 above a pre-determined frequency. The high pass filter 32 and equalization filter 34 may be combined in one in a practical implementation which may be a software implementation running on a digital signal processor or a hardware implementation or a combination of hardware and software. The filter functions may be implemented in software or firmware on a digital signal processor (DSP). A suitable DSP may be implemented on a loudspeaker driver integrated circuit such as the NXP TFA9887 which also contains a class D audio amplifier. High pass filter may be a steep high-pass filter with a cut-off frequency sufficiently high to prevent excessive excursion from the speaker membrane. Equalization filter 34 may shape the receiver speaker frequency response in magnitude and/or phase such as it matches that of the hands-free speaker in the high-pass filter pass-band. It is therefore different than the characteristic of the equalization filter when in handset mode. Since the receiver speaker 10 and the hands-free speaker 12 are spatially separated by using the hands-free speaker 12 together with the receiver speaker 10, the spatial sound reproduction may be improved compared to the situation where the hands-free speaker 12 is used on its own.

Figure 5:
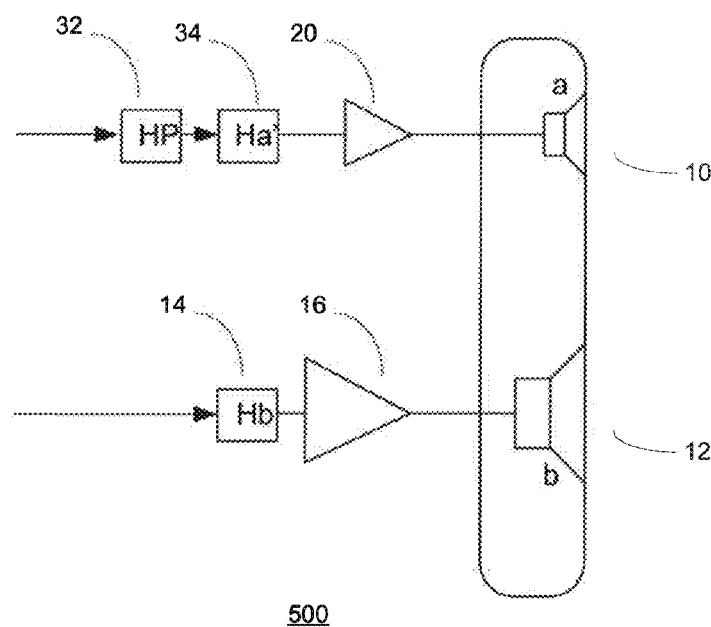
FIG. 5 shows a mobile device for a stereo audio signal according to an embodiment.

FIG. 5 shows a mobile device 500 having a receiver speaker 10 and a hands-free speaker 12 and configured in the hands-free mode of operation. A high pass filter 32 may be connected to a receiver equalisation filter 34. The output of the receiver equalisation filter 34 may be connected to a receiver amplifier 20. The output of receiver amplifier 20 may be connected to the receiver speaker 10. The combination of high pass filter 32, receiver equalisation filter 34, receiver amplifier 20, and the receiver speaker 10 may form a first audio signal path. Hands-free equalisation filter 14 has an output connected to an input of a hands-free speaker amplifier 16. The output of hands-free amplifier 16 to connected to the hands-free loudspeaker 12. The combination of hands-free equalisation filter 14, hands-free speakerphone 16, and hands-free loudspeaker 12 may form a second audio signal path. The mobile device 500 is shown configured to transmit a stereo audio signal, i.e. the audio signal contains two channels. In this case, an audio signal carrying one of the channels is routed to the first audio signal path and a second audio signal carrying the second channel may be routed to the second audio signal path. In operation, the receiver speaker may output one of the stereo signals and the hands-free speaker 12 may output the other stereo signal.

The skilled person will appreciate that for the handset mode of operation for mobile device 500, which is not shown in FIG. 5, the signal path and filtering operation may be the same as shown for the mobile phone 100. Switching between the two modes of operation may be done in software, hardware or a combination of software and hardware.

Figure 6:
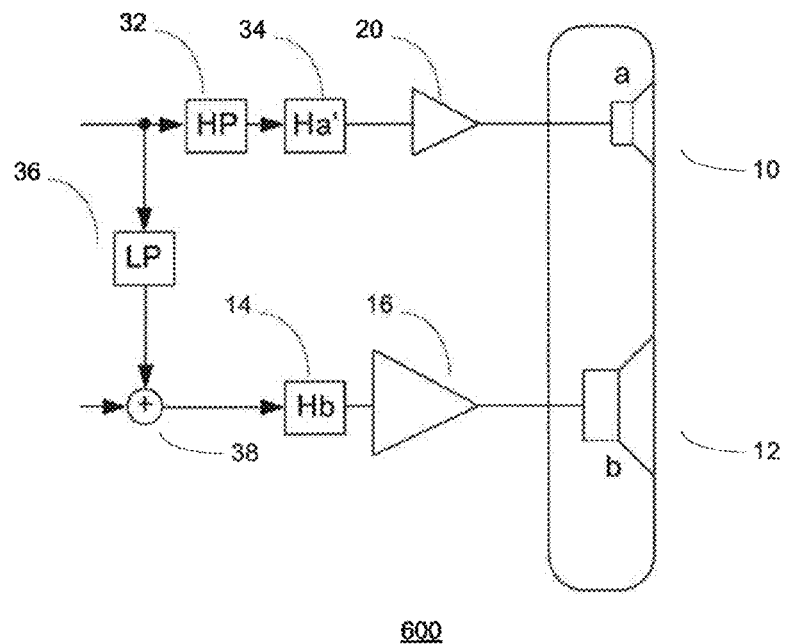
FIG. 6 illustrates a mobile device configured in hands free mode for a stereo audio signal according to an embodiment.

FIG. 6 shows a mobile device 600 having a receiver speaker 10 and a hands-free speaker 12 and configured in the hands-free mode of operation. A high pass filter 32 may be connected to a receiver equalisation filter 34. The output of receiver equalisation filter 34 may be connected to a receiver amplifier 20. The output of receiver amplifier 20 may be connected to the receiver speaker 10. The combination of high pass filter 32, receiver equalisation filter 34, receiver amplifier 20, and the receiver speaker 10 may form a first audio signal path. Hands-free equalisation filter 14 has an output which may connect to an input of a hands-free speaker amplifier 16. The output of hands-free amplifier 16 may connect to the hands-free loudspeaker 12. The combination of hands-free equalisation filter 14, hands-free speakerphone 16, and hands-free loudspeaker 12 may form a second audio signal path. A cross path filter 36 has an input connected to the input of the first audio signal path and an output connected to a mixer 48. The cross path filter 36 may have a low pass filter characteristic. The stop band of the cross path filter 36 may overlap the pass band of the high pass filter 34. The output of the mixer 48 is connected to the input of the hands-free equalization filter 14. The mobile device 500 is shown configured to transmit a stereo audio signal, i.e. the audio signal contains two channels. In operation, an audio signal carrying one of the channels is routed to the first audio signal path and a second audio signal carrying the second channel mixed with the audio signal output of the cross path filter 36 may be routed to the second audio signal path. This may allow the audio content of the stereo signal which is filtered out by the high pass filter 32 to be output via the second audio path. This ensures the audio content is not lost.

The skilled person will appreciate that for the handset mode of operation for mobile device 500, which is not shown in FIG. 6, the signal path and filtering operation may be the same as shown for the mobile phone 100. Switching between the two modes of operation may be done in software, hardware or a combination of software and hardware.

Figure 7:
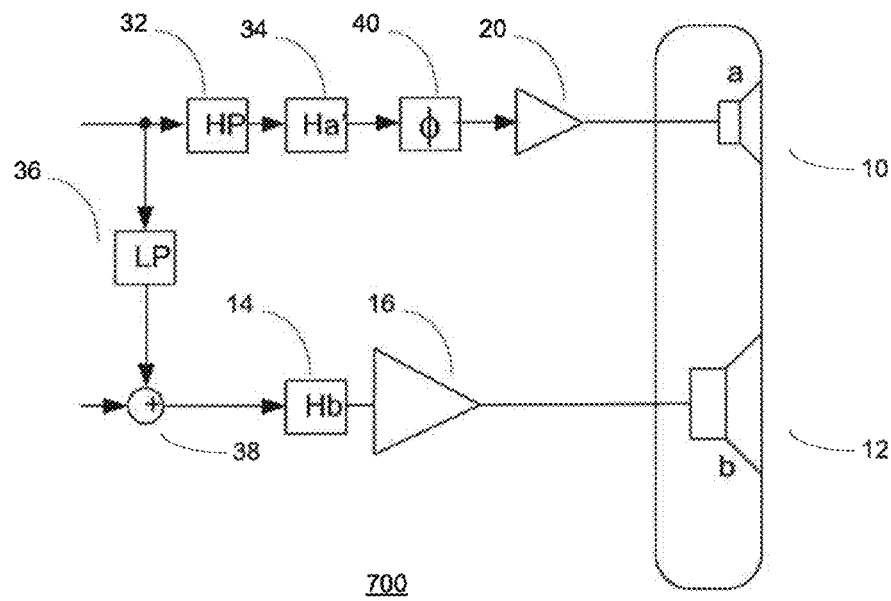
FIG. 7 shows a mobile device configured in hands-free mode for a stereo audio signal with a cross-path filter and phase shifter according to an embodiment.

FIG. 7 shows a mobile device 700 having a receiver speaker 10 and a hands-free speaker 12 and configured in the hands-free mode of operation. A high pass filter 32 may be connected to a receiver equalisation filter 34. The output of receiver equalisation filter 34 may be connected to a phase shifter 40. The output of the phase shifter 40 may be connected to a receiver amplifier 20. The output of receiver amplifier 20 is connected to the receiver speaker 10. The combination of high pass filter 32, receiver equalisation filter 34, phase shifter 40, receiver amplifier 20, and the receiver speaker 10 may form a first audio signal path. Hands-free equalisation filter 14 has an output connected to an input of a hands-free speaker amplifier 16. The output of hands-free amplifier 16 is connected to the hands-free loudspeaker 12. The combination of hands-free equalisation filter 14, hands-free speakerphone 16, and hands-free loudspeaker 12 may form a second audio signal path. A cross path filter 36 has an input connected to the input of the first audio signal path and an output connected to a mixer 48. The output of the mixer 48 is connected to the input of the hands-free equalization filter 14. The mobile device 700 is shown configured to transmit a stereo audio signal, i.e. the audio signal contains two channels. In operation, an audio signal carrying one of the channels is routed to the first audio signal path and a second audio signal carrying the second channel mixed with the audio signal output of the cross path filter 36 may be routed to the second audio signal path. This allows the audio content of the stereo signal which is filtered out by the high pass filter 32 to be output via the second audio path. This ensures the audio content is not lost. The phase shifter 40 may shift the phase of the acoustic output of the receiver speaker 10 by 180 degrees to reverse the polarity with respect to the acoustic output of the hands-free speaker 12. Reversing the polarity is known to improve the perceived sound stage width. Alternatively the phase shifter 40 may be in the second signal path to provide the phase shift to the second audio signal path. The high-pass filter 32, the equalizer 34 and the phase shifter 40 may be implemented as a single filter.

The skilled person will appreciate that for the handset mode of operation for mobile device 700, which is not shown in FIG. 7, the signal path and filtering operation may be the same as shown for the mobile phone 100. Switching between the two modes of operation may be done in software, hardware or a combination of software and hardware.

Figure 8:
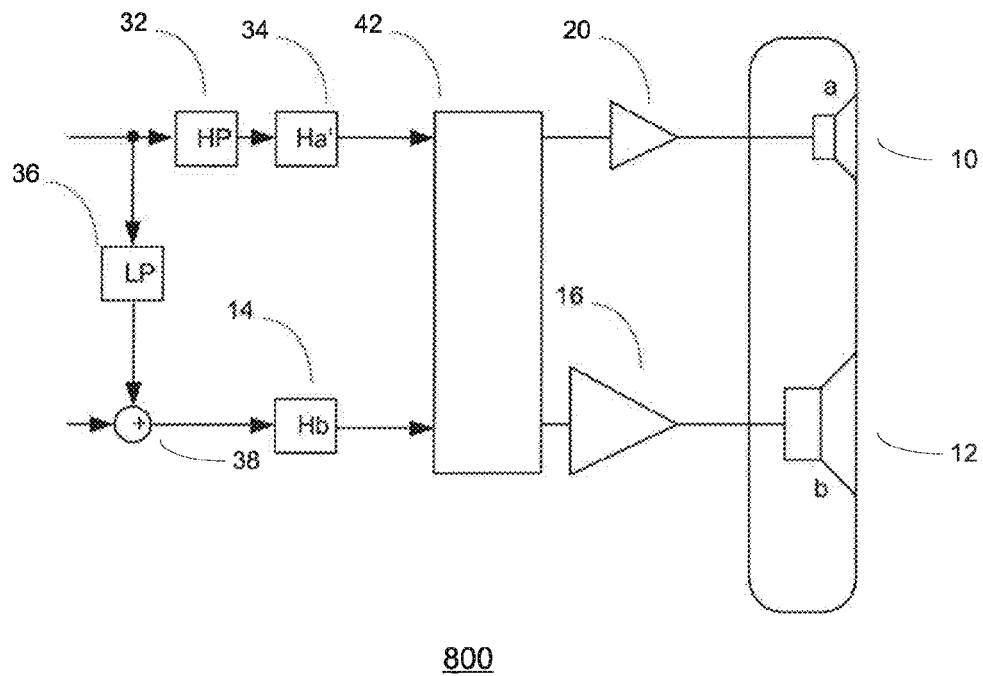
FIG. 8 shows a mobile device configured in hands-free mode for a stereo audio signal with a cross-path filter and a spatial sound processor according to an embodiment.

FIG. 8 shows a mobile device 800 having a receiver speaker 10 and a hands-free speaker 12 and configured in the hands-free mode of operation. A high pass filter 32 may be connected to a receiver equalisation filter 34. The output of receiver equalisation filter 34 may be connected to a first input spatial sound processor 42. An output of the spatial sound processor 42 may be connected to a receiver amplifier 20. The output of receiver amplifier 20 is connected to the receiver speaker 10. The combination of high pass filter 32, receiver equalisation filter 34, spatial sound processor 42, receiver amplifier 20, and the receiver speaker 10 may form a first audio signal path. Hands-free equalisation filter 14 has an output connected to an input the spatial sound processor 42. A second output of spatial sound processor 42 may be connected to an input of a hands-free speaker amplifier 16. The output of hands-free amplifier 16 may be connected to the hands-free loudspeaker 12. The hands-free equalisation filter 14, hands-free speakerphone 16, spatial sound processor 42, and hands-free loudspeaker 12 may form a second audio signal path. A cross path filter 36 may have an input connected to the input of the first audio signal path and an output connected to a mixer 48. The output of the mixer 48 may be connected to the input of the hands-free equalization filter 14. The mobile device 800 is shown configured to transmit a stereo audio signal having two audio channels. In operation, an audio signal carrying one of the channels is routed to the first audio signal path and a second audio signal carrying the second channel mixed with the audio signal output of the cross path filter 36 is routed to the second audio signal path. This allows the audio content of the stereo signal which is filtered out by the high pass filter 32 to be output via the second audio path so that the audio content is not lost. The spatial sound processor 42 may use processing techniques known to the skilled person to provide a further improved spatial sound experience in the form of stereo widening or 3D virtualization. These techniques may include polarity inversion, which results in a dipole (figure of eight) frequency response that is known to provide an increased perceived sound stage width.

The skilled person will appreciate that for the handset mode of operation for mobile device 800, which is not shown in FIG. 8, the signal path and filtering operation may be the same as shown for the mobile phone 100. Switching between the two modes of operation may be done in software, hardware or a combination of software and hardware.

Figure 9:
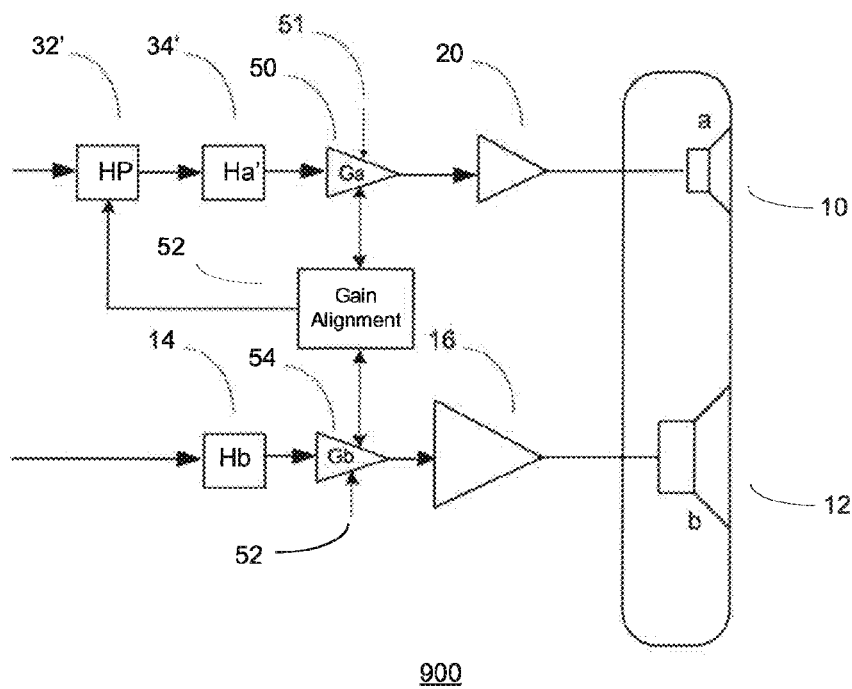
FIG. 9 shows a mobile device with variable gain alignments of the receiver speaker and hands-free speaker according to an embodiment.

FIG. 9 shows a mobile device 900 having a receiver speaker 10 and a hands-free speaker 12 and configured in the hands-free mode of operation. The high pass filter 32' may be connected to a receiver equalisation filter 34'. The output of receiver equalisation filter 34' may be connected to the input of a receiver audio processor 50. The output of the receiver audio processor 52 may be connected to a receiver amplifier 20. The output of receiver amplifier 20 may be connected to the receiver speaker 10. The combination of, high pass filter 32', receiver equalisation filter 34', receiver audio processor 50, receiver amplifier 20, and the receiver speaker 10 may form a first audio signal path. An output of hands-free equalisation filter 14 may be connected in input of a hands-free audio processor 54. An output of the hands-free audio processor may be connected to an input of the hands-free speaker amplifier 16. The output of hands-free amplifier 16 may be connected to the hands-free loudspeaker 12. The combination of hands-free equalisation filter 14, hands-free speakerphone 16, hands-free audio processor 54 and hands-free loudspeaker 12 may form a second audio signal path. Gain alignment module 52 may be connected to the receiver audio processor 50, the hands-free audio processor 54 and the high-pass filter 32'. The receiver audio processor 50 and the hands-free audio processor 54 may have external control inputs. The mobile device 900 is shown configured to transmit a stereo audio signal containing two channels. In this case, an audio signal carrying one of the channels is routed to the input of the high pass filter 32' on the first audio signal path and a second audio signal carrying the second channel may be routed to the input of the hands-free equalization filter 14 on the second audio signal path. In operation, the receiver speaker 10 may output one of the stereo signals and the hands-free speaker 12 may output the other stereo signal. The skilled person will appreciate that for the handset mode of operation for mobile device 900, which is not shown in FIG. 9, the signal path and filtering operation may be the same as shown for the mobile phone 100. Switching between the two modes of operation may be done in software, hardware or a combination of software and hardware.

The hands-free audio processor 54 and the receiver audio processor 50 may implement audio processor functions including automatic gain control, multiband dynamic range compression, and gain limiting. The receiver audio processor 50 may have a time varying gain of Ga(t) and the hands-free audio processor 54 may have a time varying gain Gb(t). Because of the audio paths may have different processing, to preserve the spatial sound the audio paths may be aligned by gain alignment module 52. Gain alignment module 52 may detect the gain of the receiver audio processor module 50 and the hands-free audio processor module 52 and adjust the gain, for example by making Ga(t) and Gb(t) equal to the minimum of Ga(t) and Gb(t). The time-varying gain can be frequency dependent, in which case, the alignment of Ga(t) and Gb(t) may be done on a frequency-per-frequency basis. This alignment may compensate for variable processing gains through the different audio paths. Alternatively the gain may be adjusted by receiver control input 51 to the receiver audio processor 50 and the hands-free control input 52 to the hands-free audio processor 52. The receiver control input 51 may be coupled to a software controlled register which may control the gain of receiver audio processor 51 dependent on the gain of receiver amplifier 20. The hands-free control input 52 may be coupled to a software controlled register which may control the gain of hands-free audio processor 52 dependant on the gain of hands-free amplifier 16.

At high audio playback levels, the receiver audio path gain may be limited to prevent amplifier clipping or speaker damage. The gain alignment results in a suboptimal use of the hands free speaker. Therefore, the gain alignment module 52 may also control the high-pass filter 32' cut-off frequency. A higher cut-off frequency increases signal headroom and may allow a higher gain on the receiver audio path and, due to the gain alignment, on the hands free audio path as well. At low playback levels, the high-pass filter cut-off frequency can be reduced without generating a gain reduction. This increases the frequency range where both loudspeakers are acoustically matching and results in a better spatial rendering.

FIG. 10(a) illustrates the effect of equalization filter 34 on the receiver frequency response measured under far-field conditions. The filter characteristic shapes the response 60 to more closely match the amplitude and/or phase of the hands-free speaker response 62 in the high frequency pass band determined by the high pass filter 32. It is therefore different to the filtering applied during handset mode as illustrated by line 64 showing the frequency response of the receiver speaker 10 in handset mode. FIG. 10b illustrates the effect of the effect of the high-pass filter cut-off frequency adaptation on the loudspeaker output spectra for mobile phone 900 shown in FIG. 9. Dotted line 66 shows the hands-free loudspeaker 12 response at a level of 6 dB above line 67. The receiver speaker 10 response corresponding to dotted One 66 is shown in dotted line 68 with the high pass filter 32' set to a high pass cut-off at 2 KHz and the receiver speaker 10 response corresponding to line 67 is shown as line 69 where high pass filter 32' is set to a high pass cut-off of 1 KHz. By dynamically adjusting the filter response of high pass filter 32' according to input signal level, the response of the receiver speaker 10 can track the hands-free loudspeaker 12 over a wider dynamic range.

Figure 11:
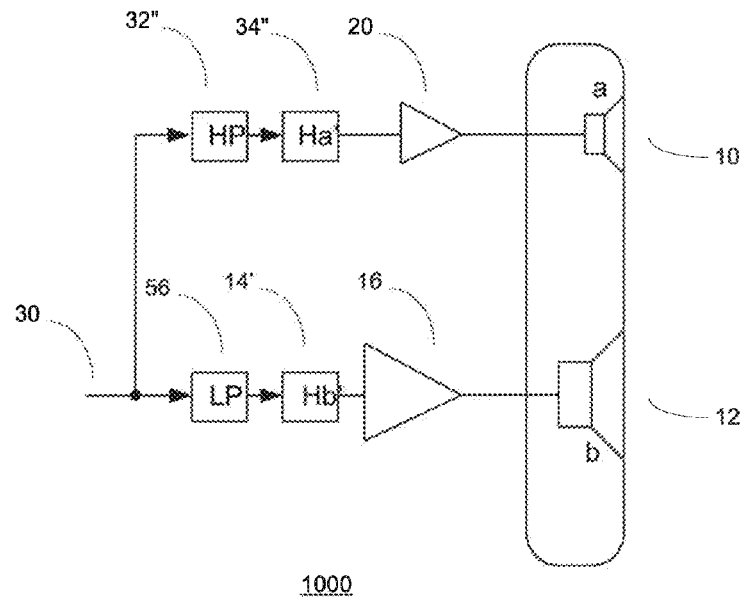
FIG. 11 shows a mobile device according to an embodiment.

FIG. 11 shows a mobile device 1000 having a receiver speaker 10 and a hands-free speaker 12 and configured in the hands-free mode of operation. A high pass filter 32" may be connected to a receiver equalisation filter 34". The output of receiver equalisation filter 34" may be connected to a receiver amplifier 20. The output of receiver amplifier 20 may be connected to the receiver speaker 10. The combination of high pass filter 32", receiver equalisation filter 34", receiver amplifier 20, and the receiver speaker 10 may form a first audio signal path. A low-pass filter 56 may be connected to a hands-free equalisation filter 14'. The hands-free equalisation filter 14' may have an output connected to an input of a hands-free speaker amplifier 16. The output of hands-free amplifier 16 may be connected to the hands-free loudspeaker 12. The low-pass filter 56, hands-free equalisation filter 14', hands-free speakerphone 16, and hands-free loudspeaker 12 may form a second audio signal path. The mobile device 1000 is configured to transmit a mono audio signal, i.e. the audio signal contains only one channel. In this case, the audio signal may be received at an audio input 30 and may be routed both to the first audio signal path and to the second audio signal path. Consequently both audio signal paths receive the same audio signal. The skilled person will appreciate that for the handset mode of operation which is not shown in the embodiment, the signal path and filtering operation may be the same as shown for the mobile phone 100. Switching between the two modes may be done in software, hardware or a combination of software and hardware.

In operation of the mobile device 1000, the two loudspeakers may be combined to form a 2-way system, as illustrated in FIG. 11 in a mono case. For a stereo input signal, the input may be a down-mix of the two audio channels. The crossover frequency between low pass filter 56 and high-pass filter 32" may be chosen such that the hands-free speaker is mostly operated in a frequency range where only mechanical protection is required, while the receiver speaker is mostly operated in the frequency range where only thermal protection is required. The person skilled in the art will appreciate that high pass filter 32" and loudspeaker equalization filter 14' may have different filter characteristic than that described in other embodiments.

Figure 12:
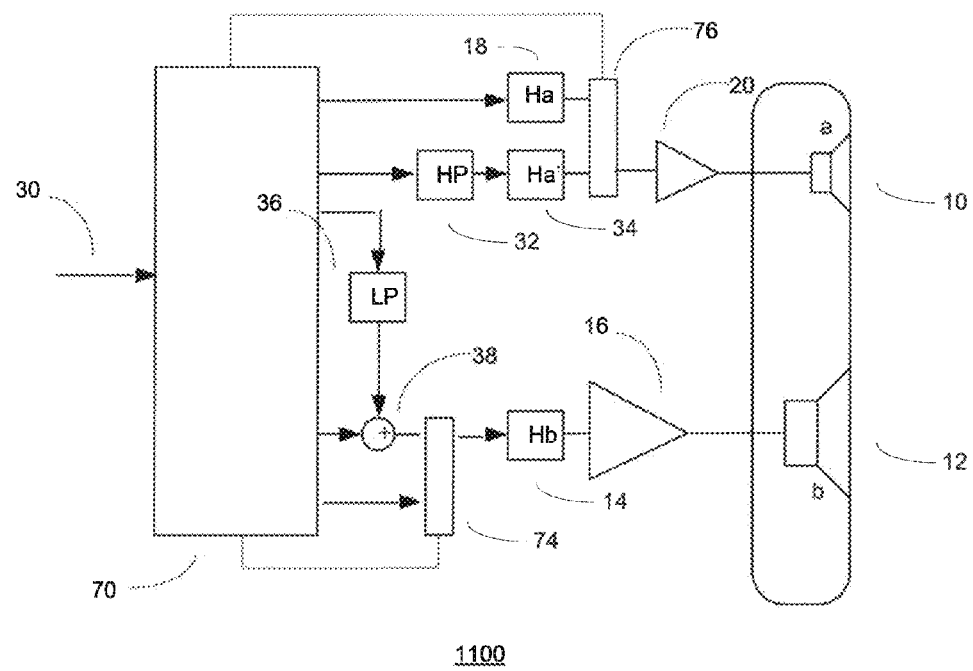
FIG. 12 shows a mobile device with a speaker system according to an embodiment.

FIG. 12 shows a mobile device 1100 with a speaker system illustrating the control of the different modes. Router 70 has an input 30 receiving an audio input signal. An audio output of the router 70 is connected to an input of a handset mode equaliser filter 18. An audio output of the router 70 is connected to an input of high pass filter 32. An audio output of the router 70 is connected to low pass filter 50. An audio output of the router 70 may be connected to a cross-path filter 36. An audio output of router 70 is connected to mixer 38. An audio output of router 70 is connected to multiplexer 74. A control output of router 70 is connected to a control input of multiplexer 74. The output of multiplexer 74 is connected to an input of hands-free equaliser filter 14. An output of hands-free equaliser filter 14 is connected to an input of amplifier hands-free amplifier 16. An output of hands-free amplifier 16 is connected to hands-free speaker 12. An output of equaliser filter 18 is connected to an input of multiplexer 76. An output of high pass filter 32 may be connected to an input of hands-free mode equaliser filter 34. An output of hands-free mode equaliser filter 34 may be connected to an input of multiplexer 76. A control output of router 70 is connected to a control input of multiplexer 76. An output of multiplexer 76 is connected to an input of receiver amplifier 20. An output of receiver amplifier 20 is connected to receiver speaker 10.

In operation of mobile device 1100, the router 70 may route an audio signal from input 30 to one of the router audio outputs. The audio signal may contain one or more audio channels. If an audio signal contains more than one channel, the router 70 may divide the audio signal and route an audio signal with one channel to one of the audio outputs and a second audio signal carrying the other channel to one or more of the other audio outputs. The skilled person will appreciate that the router 70 may be implemented by software running on a processor, hardware, or a combination of software and hardware. In a handset mode, the router may route the audio signal from input 30 to the input of handset equaliser filter 18. The router 70 may select multiplexer 76 to route the output of handset equaliser filter 18 to the input of receiver amplifier 20.

In a hands-free mode of operation, the router 70 may route an audio signal from input 30 to the input of high pass filter 32 and the input of multiplexer 74. The router 70 may configure the multiplexer 76 so that the signal from the output of high pass filter 32 is routed to the receiver speaker 10. Router 70 may configure multiplexers 74 so that the signal from the input 30 is routed to the hands-free speaker 12. This corresponds to the mobile device 400 shown in FIG. 4, where the input audio signal is a mono signal. In hands-free mode where the input signal is a stereo signal the router 70 may output the first channel of the stereo signal to the input of high pass filter 32 and output the first channel of the stereo signal to the input of low pass filter 36. In this case the second channel may be mixed with the output of cross path filter 36 by audio mixer 38. Second channel of the input signal may be output directly to the multiplexer 74. The router 70 may control the multiplexer 74 to select between the direct second channel output and the mixed second channel output. The output of the multiplexer 74 may be filtered by hands-free equalization filter 14 and amplified by hands-free amplifier 16 which may drive the hands-free speaker 12.

The skilled person will appreciate that the filters, multiplexing and routing illustrated in the mobile device 1100, and the filters in the other exemplary embodiments may be implemented using either software, hardware, or a combination of software and hardware. The receiver amplifier 20 and the hands-free speaker amplifier 16 may be class D audio amplifiers. The term connection used herein may be a physical connection or a virtual connection between modules implemented in software.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A mobile device configured to switch between a handset mode and a hands-free mode, the mobile device comprising:
    a receiver speaker configured to receive at least one audio signal at an input and operate in both the hand-set mode and the hands-free mode of the mobile device;
    a hands-free speaker configured in only the hands-free mode of the mobile device, wherein the mobile device is configured in the hands-free mode to route the at least one audio signal to both the receiver speaker and the hands-free speaker; and
    a cross-path filter having an input, an output, and a low pass filter characteristic, configured in the hands-free mode such that the input of the cross-path filter is coupled to a first audio input;
    a mixer configured to combine the output of the cross-path filter with the at least one audio signal to produce a combined audio signal; and
    a spatial sound processor coupled to receive input from both the first audio input and the combined audio signal from the mixer and respectively provide output to both the receiver speaker and the hands-free speaker, wherein the receiver speaker operates on a treble range of frequencies and the hands-free speaker operates on a bass range of frequencies.

2. The mobile device of claim 1, further comprising:
    a receiver equalization filter having an output coupled to the receiver speaker;
    a hands-free equalization filter having an output coupled to the hands-free speaker; wherein the mobile device is configured in the hands-free mode to route the at least one audio signal to inputs of both the receiver equalization filter and the hands-free equalization filter.

3. The mobile device of claim 2, wherein the receiver equalization filter is configured to have a first filter characteristic in the hand-set mode, and a second filter characteristic in the hands-free mode, wherein the first filter characteristic is different from the second filter characteristic.

4. The mobile device of claim 2, further comprising:
    a high pass filter, wherein the mobile device is configured in the hands free mode to couple the high pass filter and the receiver equalization filter in a filter cascade and to route the at least one audio signal to the filter cascade.

5. The mobile device of claim 4, wherein the cross-path filter and the high-pass filter are configured as a cross-over filter network.

6. The mobile device of claim 4, further comprising:
    a low pass filter having an output coupled to an input of the hands-free equalization filter.

7. The mobile device of claim 4, further comprising:
    a receiver audio processor coupled to an input of the high pass filter;
    a hands-free audio processor coupled to the input of the hands-free equalizer filter; and
    a gain aligner coupled to the hands-free audio processor, the receiver audio processor, and the high-pass filter; wherein the gain aligner is configured to align time and/or frequency dependent gain between a first audio signal routed to the receiver speaker and a second audio signal routed to the hands-free speaker.

8. The mobile device of claim 4, wherein the high pass filter is configured to track a response of the receiver speaker to a response to the hands-free speaker.

9. The mobile device of claim 5, wherein a stop band of the cross-path filter corresponds to a pass band of the high-pass filter in the cross-over filter network.

10. The mobile device of claim 2, further comprising:
    wherein, in operation, the spatial sound processor processes the at least one audio signal such that perceived spatial separation of the receiver speaker and the hands-free speaker is increased.

11. The mobile device of claim 1, wherein the mobile device is configured in the hands-free mode to route a first audio signal to the hands-free speaker and to route a second audio signal to the receiver speaker.

12. The mobile device of claim 1 configured as one of a mobile phone and a tablet computer.

13. The mobile device of claim 1, wherein the hands-free speaker is configured to operate in a frequency range wherein only mechanical protection is required.

14. The mobile device of claim 1, wherein the receiver speaker is configured to operate in a frequency range wherein only thermal protection is required.

15. The mobile device of claim 1, wherein the receiver speaker is configured to output a first stereo signal and the hands-free speaker is configured to output a second stereo signal.

16. A method of generating an acoustic output from a mobile device, the mobile device comprising both a receiver speaker and a hands-free speaker, the method comprising:
    in response to switching the mobile device into a handset mode, routing at least one audio signal to the receiver speaker; and
    in response to switching the mobile device into a hands-free mode, routing the audio signal to both the receiver speaker and the hands-free speaker;
    configuring a cross-path filter having an input, an output, and a low pass filter characteristic, in the hands-free mode such that the input of the cross-path filter is coupled to a first audio input and the output of the cross-path filter is coupled to a mixer where it is combined with the at least one audio signal to produced a combined audio signal; and configuring a spatial sound processor to receive input from both the first audio input and the combined audio signal from the mixer and respectively provide output to both the receiver speaker and the hands-free speaker, wherein the receiver speaker operates on a treble range of frequencies and the hands-free speaker operates on a bass range of frequencies.

17. The method of claim 16, further comprising:

in the handset mode, applying a first equalizer filter to the at least one audio signal and outputting the first filtered audio signal through the receiver speaker, and in the hands-free mode, applying a second equalizer filter to the at least one audio signal and outputting the second filtered audio signal through the receiver speaker.

18. The method of claim 16, further comprising:

in the hands-free mode, applying a high pass filter to the at least one audio signal; and outputting the filtered at least one audio signal through the receiver speaker.

19. The method of claim 16, further comprising:

splitting the at least one audio signal into a first audio signal channel and a second audio signal channel;

routing the first audio signal channel to the receiver speaker;

routing a mix of the first audio signal channel and the second audio signal channel to the hands-free speaker in the hands-free mode;

applying a low pass filter operation to the first audio signal channel; and mixing the low-pass filtered first audio signal channel with the second audio signal channel.

\* \* \* \* \*